(12) United States Patent
Damiano et al.

(10) Patent No.: US 9,048,065 B2
(45) Date of Patent: Jun. 2, 2015

(54) METHODS OF USING TEMPERATURE CONTROL DEVICES IN ELECTRON MICROSCOPY

(75) Inventors: John Damiano, Apex, NC (US); Stephen Mick, Apex, NC (US); David Nackashi, Raleigh, NC (US)

(73) Assignee: PROTOCHIPS, INC., Raleigh, NC (US)

( * ) Notice: Subject to any disclaimer, the term of this patent is extended or adjusted under 35 U.S.C. 154(b) by 0 days.

(21) Appl. No.: 13/498,052

(22) PCT Filed: Sep. 23, 2010

(86) PCT No.: PCT/US2010/049913
§ 371 (c)(1),
(2), (4) Date: Aug. 8, 2012

(87) PCT Pub. No.: WO2011/038062
PCT Pub. Date: Mar. 31, 2011

(65) Prior Publication Data
US 2012/0292505 A1 Nov. 22, 2012

Related U.S. Application Data

(60) Provisional application No. 61/245,465, filed on Sep. 24, 2009.

(51) Int. Cl.
*H01J 37/26* (2006.01)
*G01K 7/02* (2006.01)
(Continued)

(52) U.S. Cl.
CPC .............. *H01J 37/20* (2013.01); *G01K 17/00* (2013.01); *G01K 17/006* (2013.01); *H01J 37/26* (2013.01); *H01J 2237/2001* (2013.01);
(Continued)

(58) Field of Classification Search
CPC ........... H01J 37/28; H01J 37/20; H01J 36/26; G01K 7/00; G01K 7/006
USPC .............. 250/443.1, 311, 443.2, 310, 307; 374/31, 33
See application file for complete search history.

(56) References Cited

U.S. PATENT DOCUMENTS 5,367,171 A * 11/1994 Aoyama et al. ............ 250/443.1
5,698,856 A * 12/1997 Frasca ....................... 250/440.11
5,898,177 A * 4/1999 Hidaka et al. ................. 250/311
(Continued)

FOREIGN PATENT DOCUMENTS

JP   3234441 B2    12/2001
JP   2002170775 A   6/2002
(Continued)

OTHER PUBLICATIONS

Burns, G.W., et. al., "The Calibration of Thermocouples and Thermocouple Materials" NIST Special Publication 250-35, Apr. 1989.*
(Continued)

*Primary Examiner* — Jack Berman
*Assistant Examiner* — Wyatt Stoffa
(74) *Attorney, Agent, or Firm* — Tristan A. Fuierer; Moore & Van Allen, PLLC (57) ABSTRACT

Methods of using temperature control devices in electron microscopes. The temperature of the device structure may be controlled to extract information about reactions and processes that was previously unobtainable.

14 Claims, 8 Drawing Sheets

(51) Int. Cl.
*H01J 37/20* (2006.01)
*G01K 17/00* (2006.01)

(52) U.S. Cl.
CPC ..... *H01J 2237/2065* (2013.01); *H01J 2237/28* (2013.01); *H01J 2237/2003* (2013.01)

(56) References Cited

U.S. PATENT DOCUMENTS

| | | | |
|---|---|---|---|
| 6,798,036 | B2 | 9/2004 | Yun |
| 7,291,847 | B2* | 11/2007 | Morrison ................. 250/440.11 |
| 7,700,927 | B2* | 4/2010 | Nagakubo et al. ......... 250/443.1 |
| 7,713,053 | B2 | 5/2010 | Mick et al. |
| 8,058,627 | B2* | 11/2011 | Zach ....................... 250/440.11 |
| 8,466,432 | B2 | 6/2013 | Damiano, Jr. et al. |
| 8,513,621 | B2 | 8/2013 | Nackashi et al. |
| 8,872,129 | B2* | 10/2014 | Damiano et al. ......... 250/443.1 |
| 2005/0142034 | A1 | 6/2005 | Kim et al. ................. 422/82.02 |
| 2005/0161605 | A1* | 7/2005 | Yokura et al. ................ 250/343 |
| 2006/0025002 | A1* | 2/2006 | Zhang et al. .................. 439/329 |
| 2007/0116086 | A1* | 5/2007 | Massoni et al. ............... 374/121 |
| 2007/0252090 | A1* | 11/2007 | van de Water et al. ....... 250/429 |
| 2007/0286254 | A1* | 12/2007 | Fon et al. ......................... 374/31 |
| 2008/0179518 | A1* | 7/2008 | Creemer et al. ............... 250/311 |
| 2008/0290290 | A1* | 11/2008 | Nagakubo et al. ......... 250/443.1 |
| 2009/0092169 | A1* | 4/2009 | Hallen et al. .................... 374/33 |
| 2010/0140497 | A1 | 6/2010 | Damiano, Jr. et al. |
| 2010/0143198 | A1 | 6/2010 | Damiano, Jr. et al. |
| 2011/0032611 | A1 | 2/2011 | Mick et al. |
| 2011/0079710 | A1* | 4/2011 | Damiano et al. ............... 250/307 |
| 2012/0141693 | A1* | 6/2012 | Ward et al. ..................... 427/585 |
| 2012/0267550 | A1* | 10/2012 | Donders et al. .......... 250/453.11 |

FOREIGN PATENT DOCUMENTS

| | | |
|---|---|---|
| JP | 2004325141 A | 11/2004 |
| JP | 2008512841 A | 4/2005 |
| JP | 2007327766 A | 12/2007 |
| WO | 9530143 A1 | 11/1995 |
| WO | 2008141147 A1 | 11/2008 |

OTHER PUBLICATIONS

Allard, L., "A New MEMS-Based System for Ultra-High-Resolution Imaging at Elevated Temperatures" Microscopy Research an Technique 72:208-215 (Jan. 2009).*
International Search Report, May 27, 2011.
Olson, Eric A., et al.; "The Design and Operation of a MEMS Differential Scanning Nanocalorimeter for High-Speed Heat Capacity Measurements of Ultrathin Films," Journal of Microelectromechanical Systems, Jun. 2003, pp. 355-364.
Japanese Office Action, Feb. 24, 2014.
European Extended Search Report, Sep. 5, 2014.
Zhang, M., et al.; "In situ Transmission Electron Microscopy Studies Enabled by Microelectromechanical System Technology," Journal of Material Research, Jul. 2005, pp. 1802-1807, vol. 20.
Japanese Office Action, Dec. 8, 2014.

* cited by examiner

FIGURE 1

(Prior Art)

FIGURE 2

(Prior Art)

FIGURE 3

(Prior Art)

FIGURE 4

(Prior Art)

METHODS OF USING TEMPERATURE CONTROL DEVICES IN ELECTRON MICROSCOPY

CROSS-REFERENCE TO RELATED APPLICATIONS

This application is filed under the provisions of 35 U.S.C. §371 and claims the priority of International Patent Application No. PCT/US2010/049913 filed on 23 Sep. 2010 entitled "Methods of Using Temperature Control Devices in Electron Microscopy" in the name of John Damiano, et al., which claims priority of U.S. Provisional Patent Application Nos. 61/245,465 filed on 24 Sep. 2009, both of which are hereby incorporated by reference herein in their entirety.

FIELD

The present invention relates generally to methods of using devices to control the temperature of a specimen for electron microscopy. Said methods help elucidate an understanding of reactions and processes that are difficult to capture using existing technology.

BACKGROUND

Transmission Electron Microscopy, or TEM, technology enables materials to be analyzed at near atomic resolution by providing high magnification, high resolution imaging and analysis capabilities. TEM enables scientists to gather information relating to a material's physical properties such as its microstructure, crystalline orientation and elemental composition. This information has become increasingly important as the need for advanced materials for use in areas such as microelectronics and optoelectronics, biomedical technology, aerospace, transportation systems and alternative energy sources, among others, increases.

TEM is accomplished by examining material specimens under a transmission electron microscope. In a transmission electron microscope, a series of electro-magnetic lenses direct and focus an accelerated beam of electrons, emitted from an electron gun contained within the microscope, at the surface of a specimen. Electrons transmitted through the specimen yield an image of the specimen's structure which provides information regarding its properties. In addition, elemental and chemical information is provided by both the transmitted electrons and the x-rays that are emitted from the specimen's surface as a result of electron interaction with the specimen. It is necessary for the electron beam to transmit not only through the specimen but also the specimen support, which must mechanically support the specimen itself.

Of particular interest are methods of imaging specimens on temperature control devices, e.g., exposing a specimen to changing temperatures at the observation region, so as to obtain additional information about a specimen as it undergoes physical and chemical changes.

SUMMARY

In one aspect, a method of determining a temperature at least one heat source element on a device using a temperature sense element is described, said method comprising:
(a) positioning a wire or thermocouple in proximity of a membrane on the device;
(b) introducing liquid or gas environments to the heat source element and measuring the wire conductivity or impedance; wherein the wire conductivity or impedance is a measure of the heat flux of the environment or the amount of heat conducted out of the element during heating, and wherein the temperature of the heat source element can be calibrated from the flux measurement or the heat conducted.

In another aspect, a method of performing electrothermal analysis on a specimen using a temperature control device is described, said method comprising:
(a) positioning at least one electrical sense element and/or at least one electrical source element on the temperature control device; and
(b) applying a thermal stimulus to the specimen while simultaneously monitoring at least one electrical property and imaging said specimen.

In one aspect, a method of determining beam-induced heating in an electron microscope is described, said method comprising
(a) placing a specimen having a known transition temperature on a temperature control device;
(b) raising the temperature of the specimen while simultaneously imaging the specimen using an electron beam;
(c) terminating the temperature increase upon visualization of the phase transition to yield an experimental transition temperature; and
(d) comparing the known transition temperature with the experimental transition temperature of the specimen to determine the amount of energy induced by the electron beam.

In another aspect, a method of determining beam-induced heating in an electron microscope is described, said method comprising
(a) placing at least two identical specimens having a known transition temperature on a multiple heater temperature control device;
(b) raising the temperature of the at least two identical specimens while simultaneously imaging a first specimen using an electron beam;
(c) terminating the temperature increase of the at least two identical specimens upon visualization of the phase transition of the first specimen; and
(d) imaging a second specimen to quantify the beam-induced heating.

In still another aspect, a method of creating a three-dimensional reconstruction of a sample using electron microscopy is described, said method comprising:
(a) serially slicing a large sample into at least two specimens;
(b) placing each specimen on a temperature control device;
(c) altering the temperature of the specimen while simultaneously imaging the specimen using an electron beam;
(d) extracting data from each specimen image; and
(e) combining the data from each specimen image to create the three-dimensional representation of the sample.

In yet another aspect, a method of time-slicing a chemical reaction or physical process for imaging in electron microscopy is described, said method comprising:
(a) placing a specimen on a temperature control device;
(b) raising the temperature of a specimen from $T_i$ to $T_h$ for y time, wherein $T_i$ is an initial temperature of the specimen and $T_h$ is a heated temperature of the specimen;
(c) terminating the heating to cool from $T_h$ to $T_c$, wherein $T_c$ is a cooled temperature of the specimen and wherein $T_i$ may be the same as or different from $T_c$;
(d) imaging and/or extracting data from the specimen at $T_c$; and
(e) repeating steps (b) through (d) x times, wherein y, $T_h$ and $T_c$ may be the same or varied from step to step.

Another aspect relates to a method of observing quenching in an electron microscope, said method comprising:
(a) placing a specimen on a temperature control device;
(b) raising the temperature of the specimen while simultaneously imaging the specimen;
(c) rapidly cooling the specimen; and
(d) imaging the specimen subsequent to cooling.

Other aspects, features and advantages of the invention will be more fully apparent from the ensuing disclosure and appended claims.

DETAILED DESCRIPTION

The present invention relates generally to methods of using devices to control the temperature of a specimen. Devices are generally constructed using semiconductor materials, and contain at least a membrane region and a frame region. Devices are placed at the specimen tip region of the holder.

As defined herein, "electron microscopy" and "electron microscope" correspond to any of scanning electron microscopy (SEM), transmission electron microscopy (TEM) and scanning transmission electron microscopy (STEM).

As defined herein, "flanked," when used in reference to electrically conductive components of the system means that the flanking components are generally arranged on either side of the flanked structure and electronically coupled to the flanked component. The fact that one component is said to be flanked by flanking components is not intended to exclude the possibility that additional components may be present between, and/or operatively associated or engaged with, the flanked component and the flanking components. Moreover, flanking elements may overlap the flanked component or may be manufactured in a manner which makes them integral with the flanked component.

As defined herein, "semiconductor" means a material, such as silicon, that is intermediate in electrical conductivity between conductors and insulators.

As defined herein, "device" means a structure used to either contain gases and/or control temperatures around a specimen and includes, but is not limited to, a window device and a temperature control device.

As defined herein, "specimen" means the object being studied in the electron microscope, typically placed within or on the device in the region of temperature and/or gas control which is at least partially electron transparent (e.g., nanoparticle, catalyst, thin section, etc.).

As defined herein, "E-cell" means a system for containing and controlling an environment around a specimen (e.g., 1 device, 2 device or 3+ device systems).

As defined herein, "holder" means a precision-machined piece of equipment used to hold and secure one or more devices either individually, as a collection, or arranged as an E-cell, and to provide an interface between the device(s) and/or E-cell and the outside world.

As defined herein, "window device" means a device used to create a physical, electron transparent barrier on one boundary of the E-cell and the vacuum environment of the electron microscope and is generally a silicon nitride-based semiconductor micro-machined part, although other semiconductor materials are contemplated.

As defined herein, "temperature control device" means a device used to control the temperature around the specimen either individually or within an E-cell and is generally a silicon carbide-based semiconductor micro-machined part, although other semiconductor materials are contemplated.

As defined herein, "frame" means a rigid region around the perimeter of a device that is used to provide mechanical support to the entire device structure. Preferred embodiments include a silicon frame selectively etched using KOH, a silicon frame selectively etched using reactive ion etching (RIE), a silicon frame selectively etched using deep reactive ion etching (DRIE), or a silicon frame released from an silicon-on-insulator (SOI) wafer.

As defined herein, "membrane region" means a region generally in the center of each device that is unsupported by the frame (e.g., in a window device the membrane region may be a thin, amorphous silicon nitride film that is electron transparent; in a temperature control device the membrane region may be a thin, silicon carbide film that might or might not be electron transparent, but provides a surface upon which a specimen can be placed and the temperature controlled. In a temperature control device the membrane region may be a thin, amorphous carbon film deposited on top of a silicon carbide film.

As defined herein, "element" means a component used on a device, typically on or near the membrane, that enhances or adds capability to the device (e.g., heat source element, mechanical element, heat sink element, or combinations thereof).

As defined herein, "mechanical element" means a component generally used to strengthen and provide rigidity to the membrane (e.g., reinforced membrane embodiment).

As defined herein, "heat source element" means a component made up of two or more electrodes through which a current is forced, creating heat through Joule heating. In a temperature control device a heat source element may be used to effect direct heating—the membrane is the heat source element directly heating the specimen (bilayer stack). Alternatively in a temperature control device a heat source element may be used to effect indirect heating—flux carries the heat across the membrane to the specimen. Many different spatial designs exist.

As defined herein, "heat sink element" means a component made up of one or more electrodes used to passively remove heat from the membrane region by providing path(s) for higher flux to occur away from the membrane.

As defined herein, "temperature sense element" means a component used to directly measure the temperature on the device (e.g., window device and/or temperature control device) and may be either frame or membrane components, but typically membrane.

As defined herein, "electrical sense element" means a component used to directly measure current or voltage on the device (e.g., temperature control device) and may be either frame or membrane, but typically membrane.

As defined herein, "mechanical sense element" means a component used to measure deflection or rupture of a membrane on the device (e.g., window device and/or temperature control device).

As defined herein, "electrode" means a component or an element used to facilitate heat or electrical flux on a device, wherein the electrode corresponds to thicker regions on the membrane, that span out over the frame, and are typically part of an element.

As defined herein, "pad" means an area on an electrode used to provide an interface between the holder and the device.

As defined herein, "refractory metals" correspond to tungsten, niobium, tantalum, molybdenum, rhenium, osmium, iridium, rhodium, ruthenium, technetium, hafnium, zirconium, vanadium, chromium, platinum, palladium and alloys thereof.

The methods described herein relate to the use of a device which can be used to control the temperature of a specimen before and/or during imaging in an electron microscope.

Temperature Control Devices

The temperature control device can include any device that allows the user to accurately, stably, and rapidly manipulate the temperature of a specimen within an electron microscope. For example, the temperature control device can be constructed using semiconductor materials, and contains at least a frame and one membrane region. It may also contain a frame and multiple membrane regions. The preferred devices are one frame and one membrane and one frame and 2, 3 or 4 membranes. An example of a preferred temperature control device includes the devices disclosed in International Patent Application No. PCT/US08/63200 filed on May 9, 2008 entitled "Microscopy Support Structures," U.S. Provisional Patent Application No. 60/916,916 filed on May 9, 2007 entitled "Microscopy Support Structures," and U.S. Provisional Patent Application No. 60/974,384 filed on Sep. 21, 2007 entitled "Microscopy Support Structures," which are all incorporated by reference herein in their respective entireties. It should be appreciated, however, that the temperature control device is not limited as such.

Figure 1:
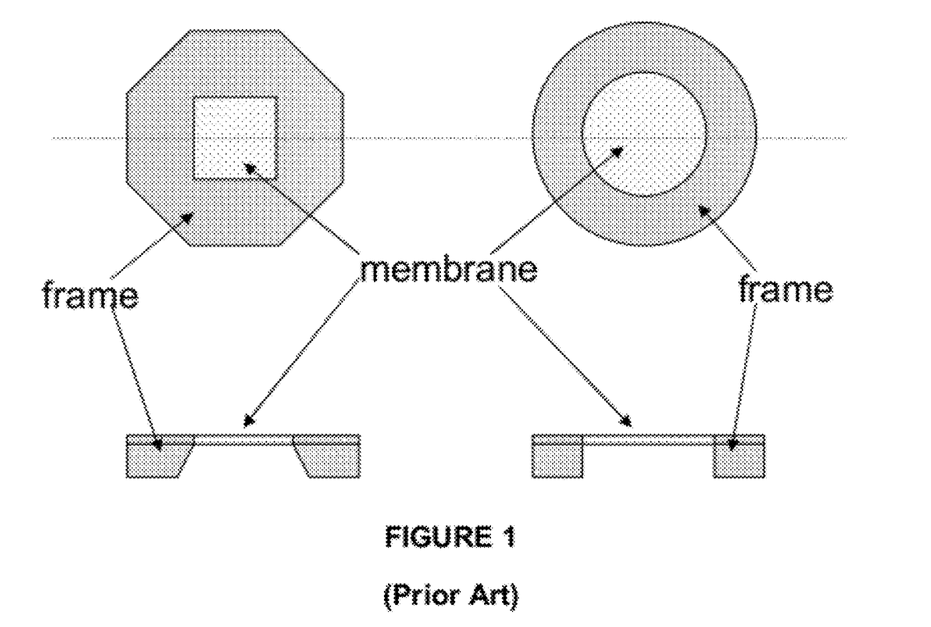
FIG. 1 illustrates the membrane region and frame region of a device described in the prior art in plan view and cross-sectional view.

The membrane region, as previously described in the aforementioned applications, is a portion of the device structure generally in the center of each device that is unsupported by the frame. The membrane region may consist of one or more thin films, including semiconductor materials as well as other deposited films such as carbon or graphene. Membrane regions are generally less than 1 micron in thickness, and are robust, insulating or conductive, but do not have to be a uniform thickness. They can serve to either create a physical barrier between the environment at the specimen and the environment within the electron microscope, or as a support upon which to place the specimen, or both. One or more membrane regions may be located on a device, and are generally separated by a thicker demarcating region between them, wherein the demarcating region is above, below and/or beside the membrane region. Membrane regions may be either continuous or have perforations in any shape or size. A device with membrane and frame regions specified is illustrated in FIG. 1.

One embodiment of a membrane region is a thin, amorphous silicon nitride film as the membrane material so that the membrane region is nearly electron transparent, and another embodiment of a membrane region is a thin, silicon carbide film as the membrane material. In this embodiment the membrane region is not required to be electron transparent although it can be electron transparent or partially electron transparent. In this embodiment the membrane material provides a surface upon which a specimen can be placed and the temperature controlled. Other membrane materials that can be used to create membrane regions include boron nitride, graphene, carbon, aluminum nitride, silicon dioxide and silicon. Membrane regions may or may not contain additional elements directly integrated onto or placed upon their top or bottom surface.

A membrane region may either be comprised of a continuous film of membrane material or may be comprised of a stack of films or membrane materials, generally resulting in a cumulative tensile stress profile. In the case of film stacks, either different membrane materials can be deposited upon one another, or the same membrane material with differing material properties (such as doping levels) may also be used.

A membrane region may contain one or more holes perforating the membrane material from the top to the bottom surface, or may contain one or more dimples in its top or bottom surface. Holes are generally circular in shape, but may also be squares, diamonds, rectangles, triangular or polygonal. Holes are generally used to create regions in a membrane region that are completely electron transparent, upon which a specimen is placed. Dimples are generally circular in shape, but may also be squares, diamonds, rectangles, triangular or polygonal. Dimples are generally used to create regions in a membrane region that are relatively more electron transparent than the non-dimpled membrane regions.

Membranes regions within devices that are used to control a specimen temperature will have a distinct heatable region within the membrane region that is generally in the center of the membrane region, and is the area where the specimen temperature is primarily controlled. This heatable region is defined by the heat generated using the heat source element. More than one heatable region may be present upon each membrane region. The membrane region itself is used as both the specimen support as well as the heatable region (i.e., the source of heat). This approach minimizes the distance between the specimen and the heatable region, allowing the sample to be in very close proximity (less than 500 nm) from the heat source.

Membrane regions may contain additional elements that serve to provide mechanical stability to the membrane itself, to provide a mechanical source or sense element to the specimen or membrane region, to provide an electrical source or sense element to the specimen or membrane region, to provide a pressure sense element to the specimen or membrane region, to provide a chemical sense element to the specimen or membrane region, and/or to provide a means to calibrate the electron microscope.

Figure 2:
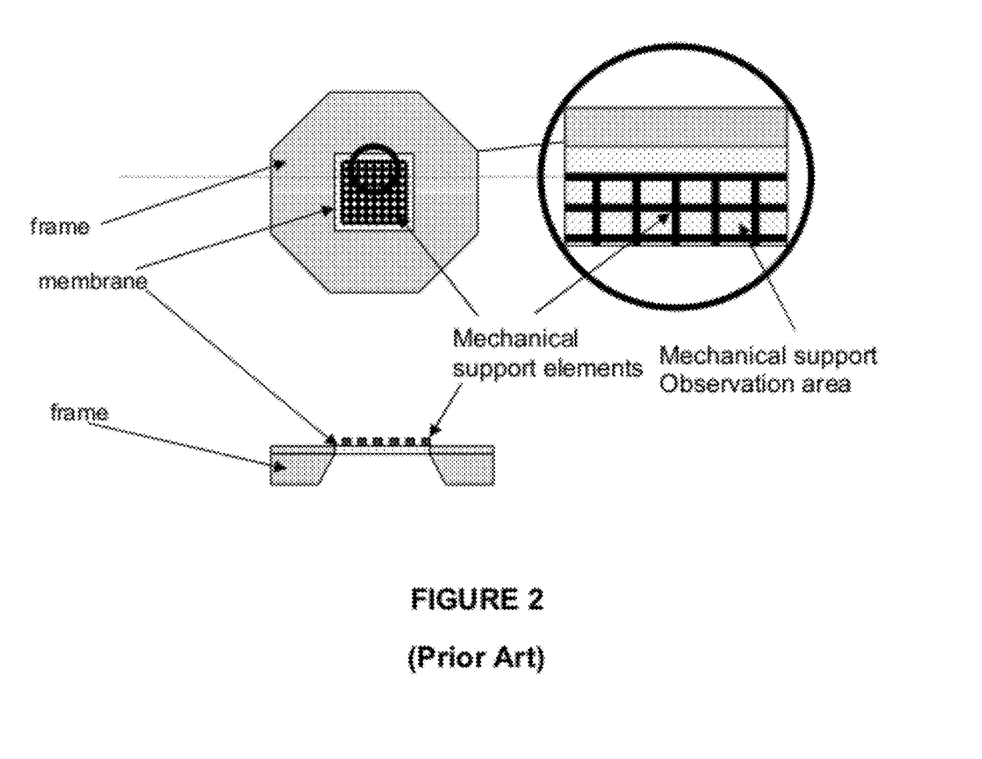
FIG. 2 illustrates the mechanical support elements of a device described in the prior art in plan view and cross-sectional view.

A mechanical support element is generally used to provide additional physical support to the membrane region itself, allowing for very thin regions to be created in the membrane region and enhancing the performance of the overall device. The mechanical support elements are a region or regions within the membrane region that are used to provide local strength for the purpose of forming an overall membrane region that is robust to mechanical forces yet contain subregions that minimize electron beam scattering. The mechanical support elements may be constructed by forming localized areas on the surface of the membrane region that are thicker than the rest of the membrane region by standard material deposition techniques. The mechanical support elements may also be constructed by forming localized areas on the surface of the membrane region that are thinner than the rest of the membrane region by standard material etching techniques. Mechanical support elements are illustrated in FIG. 2.

The mechanical support elements may be comprised of the same membrane material as the membrane region, or a different material than the membrane region. Materials for the mechanical support element(s) include semiconductors, metals and/or insulators, including silicon nitride, silicon, silicon carbide, silicon dioxide, copper, titanium, aluminum, gold, platinum, palladium, brass, tungsten and other non-magnetic alloys. The additional stress added to the membrane by the mechanical element will still result in a cumulative tensile stress profile. Mechanical elements are generally less than 5 microns thick.

The region on the membrane region where the mechanical support exists is considered the support region. If the total thickness of the support region and the membrane region is less than 1 micron and sufficiently electron transparent, it may be considered both a mechanical support and membrane observation region. Mechanical supports can be isolated features such as rectangles or squares that are patterned in the membrane material either on or off the membrane region, they can be continuous features such as screens or grids patterned in the membrane material either on or off the membrane region, they can be isolated features such as rectangles or squares that are patterned in material deposited and/or placed on top of the membrane material either on or off the membrane region, or they can be continuous features such as screens or grids that are patterned in material either deposited and/or placed on top of the membrane material either on or off the membrane region.

The regions in between the mechanical support regions are considered the observation regions through which to image the specimen. These observation regions are generally the thinnest regions of membrane region, whose overall strength is increased as a result of the mechanical support regions, and is generally the location where the specimen is placed. These observation regions are generally square in shape, but may also be circular, rectangular, hexagonal, triangular or polygonal. This observation region is typically the same as the size and shape of the entire membrane region itself, but in some instances may be considered as only the heatable region or as a subset of the membrane region. The mechanical support observation area is illustrated in FIG. 2.

Figure 3:
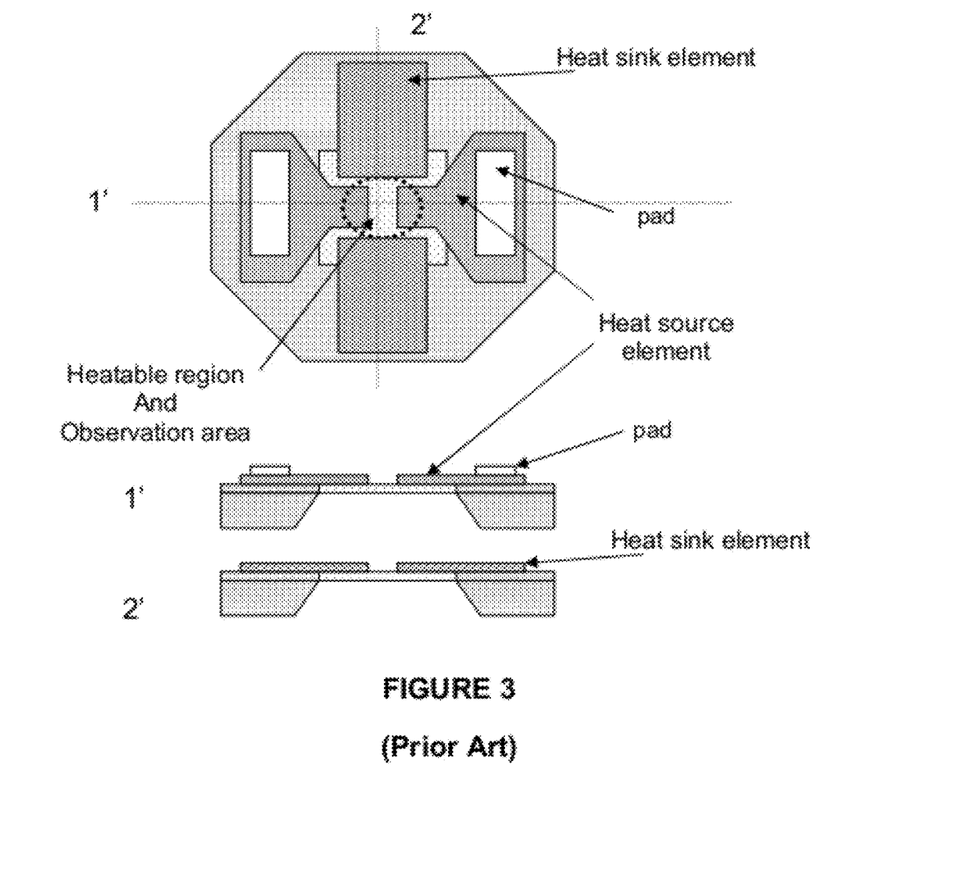
FIG. 3 illustrates the heat sink and heat source elements, heatable region, observation area, and pad region of a temperature control device described in the prior art in plan view and cross-sectional view.

In devices used to control the temperature of a specimen, heat is generated using an element on the membrane. To provide temperature stability and maintain temperature uniformity, heat sink elements are used to create additional heat flux paths from the heat source element away from the membrane region, particularly when the specimen is exposed to the vacuum environment of the electron microscope which precludes heat convection as an alternative pathway. Heat sink elements are generally placed on a membrane region when temperatures in excess of 800 degrees Celsius are expected and thermal, mechanical, or electrical instability is possible based on the design of the membrane region and any elements present on the device. Heat sink elements are used in or near the heatable region to facilitate heat transfer out of the heatable region. These features could help stabilize the temperature, allow for higher temperatures in the heatable regions, and allow for more rapid cooling of the device. An element can be used to provide a dual purpose, such as to act as a heat sink element as well as a mechanical support. Heat sink elements are illustrated in FIG. 3.

Heat sinks are constructed as elements on the surface of the membrane, and are comprised of a material or materials that have a high thermal conductivity, such as silicon carbide, silicon or non-magnetic metals such as tungsten, platinum, gold, titanium, palladium or copper and non-magnetic alloys. The heat sink elements are either thicker regions patterned on the surface of the membrane region, made from the same material, or a different material altogether. Preferred embodiments include 1) thicker regions of silicon carbide patterned directly on the membrane region, and 2) the deposition and patterning of a metal such as tungsten on top of the membrane region.

The heat sink regions are the areas on the membrane region that contain heat sink elements. The heat sink elements are generally rectangular, although other shapes are contemplated including square, triangular, elliptical, trapezoidal and polygonal and said elements may be symmetrical or asymmetrical, and are located so as to be both on the surface of the membrane and off the membrane itself, to provide a heat flux path from the heatable region onto the frame. One or more heat flux elements may be present on a device, and generally they are patterned in widths from about 2 microns up to about 500 microns, and at lengths from about 50 microns to about 1.5 millimeters. Heat sink elements are generally placed in flanking positions on the membrane, in a symmetrical pattern although asymmetrical placement is contemplated. The regions in between the heat sink regions are considered the observation areas through which to image the specimen. These are generally the thinnest regions of membrane region.

When devices contain multiple membrane regions with one or more heatable regions, heat sink structures can be used to control the dissipation of heat such that nearby (adjacent) membrane regions are thermally isolated. Heat sink structures could be used to pull heat away from specimens on membrane regions under test in specific directions along cooling fingers to further assist in thermal isolation.

It is known that heat convection from the membrane region into the area above and below the surface of the membrane region is virtually nonexistent in a vacuum, and heat sink structures can be used to define a specific thermal gradient to achieve more temperature stability and/or to provide a defined thermal gradient to specimen(s).

Figure 4:
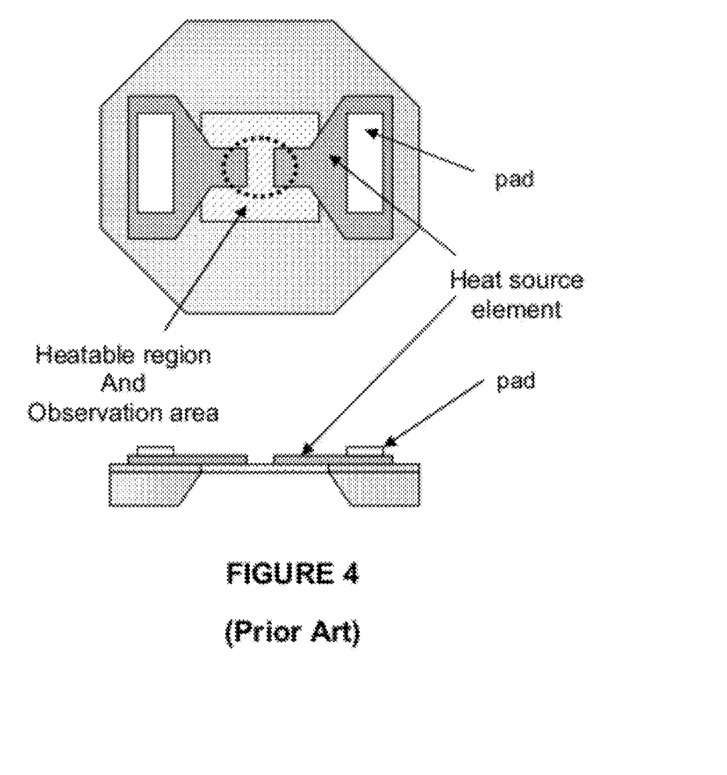
FIG. 4 illustrates the heat source element of a temperature control device described in the prior art in plan view and cross-sectional view.

Heat source elements are comprised of electrodes of sufficiently high conductivity to allow current flow for Joule heating at voltages generally less than 200V. Heat source elements are generally fabricated or placed above the frame material and are generally created from either the membrane material(s), a combination of the membrane material(s) plus subsequent material(s) deposited, grown or placed on top of the membrane material(s), or material(s) deposited, grown or placed on top of the membrane material. The presence of two or more heat source elements defines at least one heatable region on the membrane region. The heat source element(s) can extend onto the membrane region. In the case of direct heating, the heatable region and the observation region are the same. In the case of indirect heating, the observation region(s) are separate regions from the heatable region(s). Heat source elements may occupy a large area on the frame and an electrical pad may be used to facilitate electrical contact between the heat source element and the electron microscope holder. The heat source element may be more narrow near the membrane region so as to confine the electrical current path and to facilitate Joule heating across the membrane region. A preferred embodiment for direct heating is to place two heat source elements in a flanking position across the membrane region, with an observation region defined between them. The observation region is also the heating region, which is an area on the membrane region located between (and not including) the heat source elements. Heat source elements are illustrated in FIG. 4. The use of a membrane material that is at least partially conductive allows Joule heating to occur within the membrane, specifically, in the observation region that is supporting the specimen. This makes the membrane observation region itself the heatable region, and is a key differentiating feature of the devices described herein over other approaches. Directly heating the membrane (which supports the specimen) by forcing current through the material using heat source elements minimizes the distance between the heatable region and the specimen, generally to distances less than about 500 nm. This removes the ambiguity between knowing the temperature of the heater and temperature of the sample. In indirect heating, the heat source element is the heat source heatable region and the heat source observation region is located nearby being heated by heat generated in the heatable region and transferred by thermal conduction to the heat source observation region. Importantly, in indirect heating, the membrane is a thermal conductor, not an insulator. Moreover, the heaters use a semiconductor material as the heater and not spiral metal heaters as found in prior art devices.

Heat source elements are generally deposited and patterned on the surface of the device, and are located both on the frame and the membrane. They are manufactured using a material that is highly conductive. Preferred materials for manufacturing heat source elements are silicon carbide and refractory metals.

In practice, when current is forced from one or more heat source elements to one or more other heat source elements through the membrane material, Joule heating will occur in the membrane material. The heat source elements may be designed in a variety of ways to selectively expose areas in the membrane region that are less conductive than the heat source elements. For example, the size and shape of each heat source element, the spatial relationship between the heat source element(s) and the membrane region(s), and the distance between heat source elements can all be designed to control the uniformity of heat on the membrane region and the localization of heat between adjacent membrane regions. Heat source elements may be designed as a simple polygon or as a complex structure with multiple fingers interdigitated with one or more other heat source elements. Preferably, the current to the heatable region results in a uniform temperature change, up or down, of at least about 1000 K in at least about 100 milliseconds, more preferably at least about 1000 K in about 50 milliseconds, even more preferably at least about 1000 K in about 25 milliseconds, and most preferably at least about 1000 K in at least about 15 milliseconds. In an alternate embodiment, the current to the heatable region results in a uniform temperature change, up or down, of at least about 1500 K in at least about 100 milliseconds, more preferably at least about 1500 K in about 50 milliseconds, even more preferably at least about 1500 K in about 25 milliseconds, and most preferably at least about 1500 K in at least about 15 milliseconds. In still another alternate embodiment, the current to the heatable region results in a uniform temperature change, up or down, of at least about 2000 K in at least about 100 milliseconds, more preferably at least about 2000 K in about 50 milliseconds, even more preferably at least about 2000 K in about 25 milliseconds, and most preferably at least about 2000 K in about 15 milliseconds.

Figure 8:
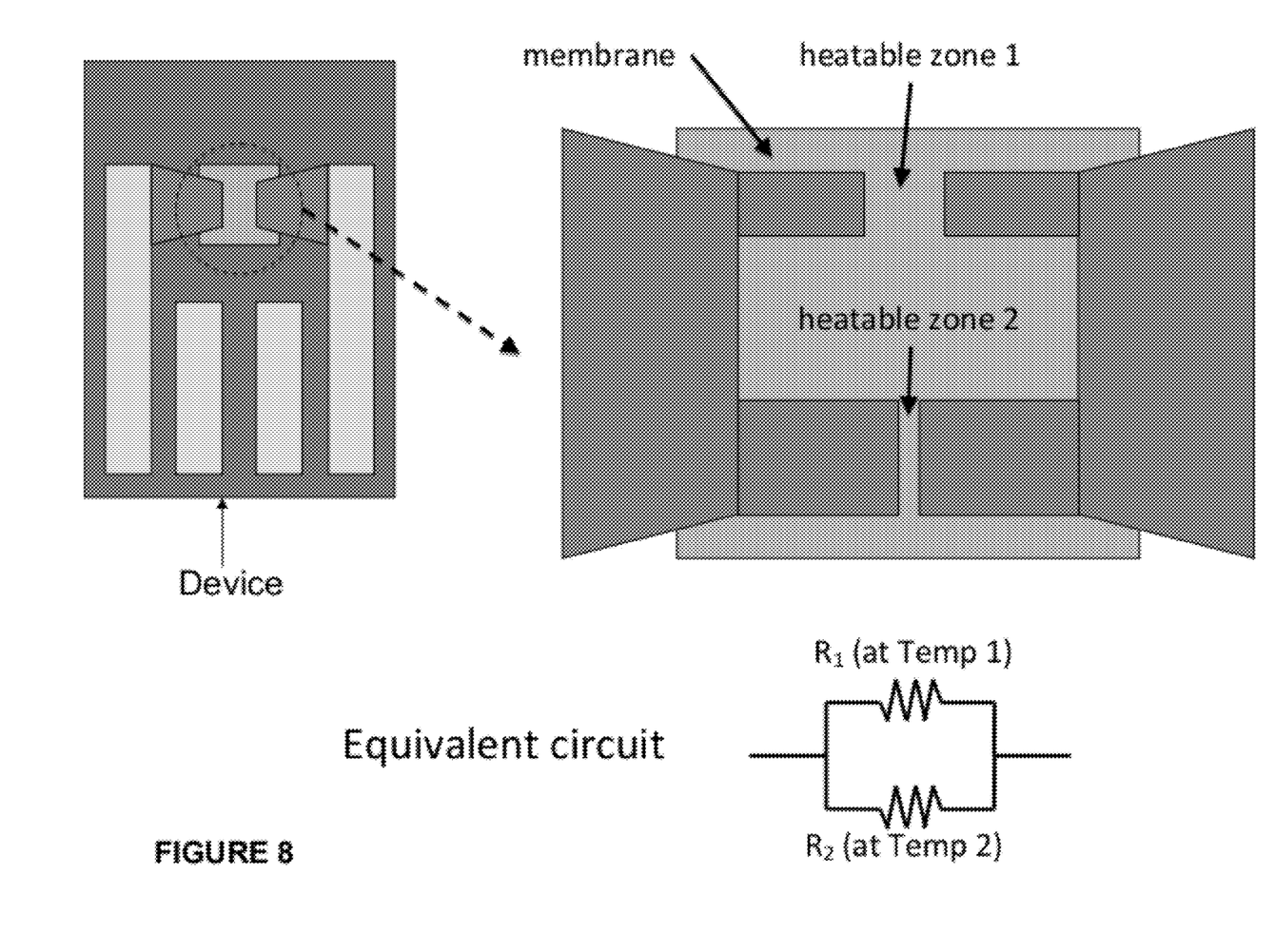
FIG. 8 illustrates a device having multiple heat source element wherein the equivalent circuit is a parallel circuit.

Multiple heat source elements can be placed on single or multiple membranes. Preferably, multiple heat source elements can be placed on a single membrane creating multiple temperature zones on a single membrane. In this way, specimens placed on one device may be observed in the same vacuum or gas environment but at different temperatures simultaneously. This would allow direct comparison between samples very near one another, presumably specimens of the same material and prepared at the same time because they are on the same small area within the grid. Multiple heat source elements can be operated independently using a separate control wire(s) for each element, or by connecting elements into a series or parallel circuit. For example, FIG. 8 illustrates a device with multiple heat source elements (i.e., heatable zone 1 and 2, which are also electron transparent windows), wherein the equivalent circuit is a parallel circuit. For the parallel circuit, the ratio of resistances or impedances would define the differences in temperatures at each element while a single current is forced across the circuit network. This is a useful technique both in vacuum, liquid or gas environments.

A temperature sense element can be included on the devices, wherein the temperature sense element is a patterned material located on the surface of the membrane region, typically on or near the observation region, used to directly measure the temperature of the observation region itself. Specimens are placed directly on the observation region, therefore, a temperature measurement in this region is an indication of the temperature of the specimen itself. Temperature sense elements may also be used to monitor the temperature in other areas on the device, such as in the heatable region if different that the observation region. Temperature sense elements are particularly important when using devices to control the temperature of a specimen while in a non-vacuum environment. Examples of this include heating a specimen within an E-cell, in which a sample is surrounded by specific liquids or gases. Another example includes using a device to control a specimen's temperature within a dedicated environmental electron microscope (TEM or SEM), in which the vacuum environment of the electron microscope chamber or specimen region (differentially pumped) is filled with a specific gas. Another example includes controlling a specimen's temperature outside of an electron microscope by using an ex-situ reactor that controls a specimen's gas or liquid environment. The importance of temperature sense elements in these applications is based on how different gases, liquids and pressures are able to remove heat from the heat source element (hence the specimen) during operation. For example, if a specimen is held to a specific temperature in a vacuum environment using Joule heating, the introduction of a gas around this specimen will cause the heat source element to cool down because the gas will begin to remove heat from the element via conduction and/or convection, resulting in a new temperature equilibrium. Because different gases, liquids and pressures all remove heat from a heat source element differently, a temperature ambiguity results during the course of an experiment if these gases, liquids or pressures are varied. By adding a temperature sense element to the device, the actual temperature loss can be measured while changing the gas or liquid environment.

Figure 9:
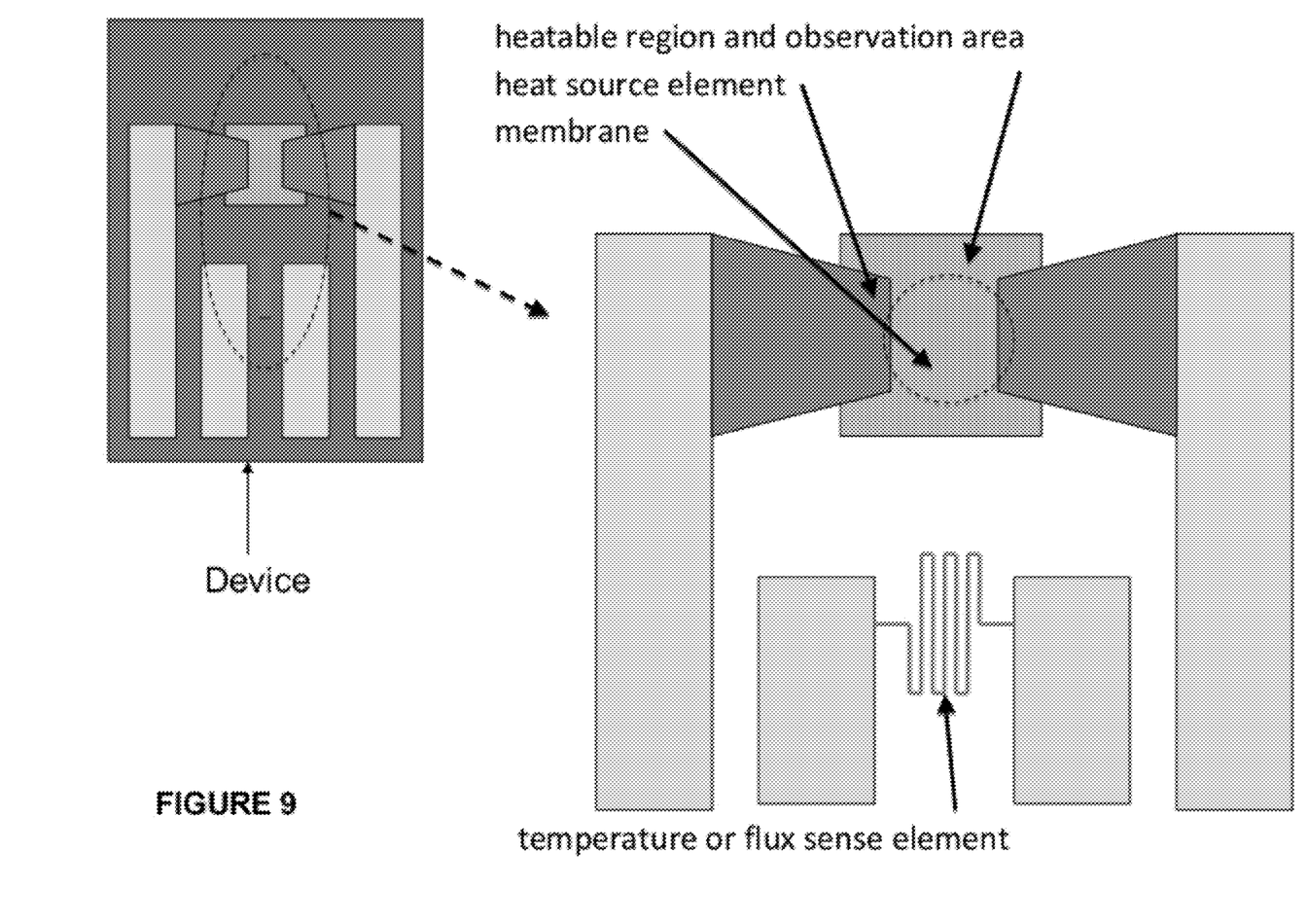
FIG. 9 illustrates a temperature sense device positioned on the device but off of the membrane.

An embodiment of a temperature sense element is a wire or thermocouple that is patterned directly across the surface of the membrane in or near the observation region. Such an embodiment must be much more conductive than the membrane region itself, generally more than 100 times. An example of such a temperature sense element is a platinum resistance thermometer. Another embodiment is to use the heat source element also as a temperature sense element by measuring the resistance or impedance during operation, which will vary with temperature. Another embodiment of a temperature sense element is a wire or thermocouple that is patterned on the device, whether on or off the membrane, or alternatively positioned off the device but in proximity of the membrane. For example, FIG. 9 illustrates one example of a temperature sense element positioned on the device but off the membrane. The wire can be preheated to a specific temperature through Joule heating (known through external calibration in a vacuum). As liquid or gas environments are introduced around the device, the temperature of this wire will decrease, which can be directly sensed by measuring the wire conductivity or impedance. This difference in temperature in the temperature sense element will be a measure of the heat flux of the environment, or the amount of heat conducted out of the element during heating. Using this measurement, the actual temperature of the heat source device can be calibrated from the temperature and flux measurement made using the temperature sense element. Using this approach, two methods of operation exist to heat a sample: 1) constant current in the heat source, and 2) constant temperature in the heat source. In method 1, a specimen is held at a specific temperature in vacuum through Joule heating. When gases, liquids and/or pressures are introduced, the actual temperature would be allowed to drop and vary but it would be known by monitoring the temperature sense element. In method 2, a specimen is held at a constant temperature by using the measurement taken from the temperature sense element to adjust the current in the heat source element through an open-loop control system, typically in external hardware or software. The other temperature sense elements described herein can be operated using these two methods as well. Another embodiment of a temperature sense element is a feature comprised of a material with known physical, chemical, and/or electrical properties at a specified temperature where such properties may be monitored in situ during electron beam analysis and heating on the membrane region. An example of such a temperature sense element is a small patterned area comprised of an alloy with a phase change at a known temperature where the phase change of the temperature sense element could be monitored or observed and thereby the temperature on the membrane region would be known in close proximity to the temperature sense element.

Another method of measuring the temperature is to correlate the change in focus of a sample (offset in the Z-direction) to temperature. When the membrane is heated, the membrane material expands slightly resulting in a slight bowing of the surface. The sample is generally located near the peak of this bow, and the distance (Z-offset) that the sample moves is directly related to the actual specimen temperature due to the thermal coefficient of expansion of the membrane material.

Electrical contacts from the holder to the device are required for any element where an electrical signal is used to measure or stimulate some response of or on the device. Electrical contacts are generally used in conjunction with electrical source or sense elements. Electrical contacts are made by defining pad regions, and the pad regions are generally directly on the surface of the respective element itself and in a region over the frame. These pad regions are areas generally greater than about 100 microns by about 100 microns defined on the element either by 1) a patterned region of material where the pad material is different from the element material, or 2) a patterned region of the element where the pad region is comprised of the same material as the element material. The use of another material is preferred when a good and/or ohmic electrical contact cannot be achieved through a physical contact between the holder and the element material.

If the element material is a metal such as tungsten, the pad region could simply be a large area within that element on the frame region. If the element material is a semiconductor or ceramic such as silicon carbide, a non-magnetic metal such as gold, tungsten, platinum, titanium, palladium or copper and non-magnetic alloys could be used. There may be multiple pads per element, and multiple elements per device. Electrical source and sense elements may be patterned in a variety of shapes and sizes depending on the specific applications, including voltage or current biasing, electrochemistry (when incorporated into a liquid E-cell), and electrophoresis and dielectrophoresis (when incorporated into a liquid E-cell). Typical shapes include rectangular and circular elements.

Figure 10:
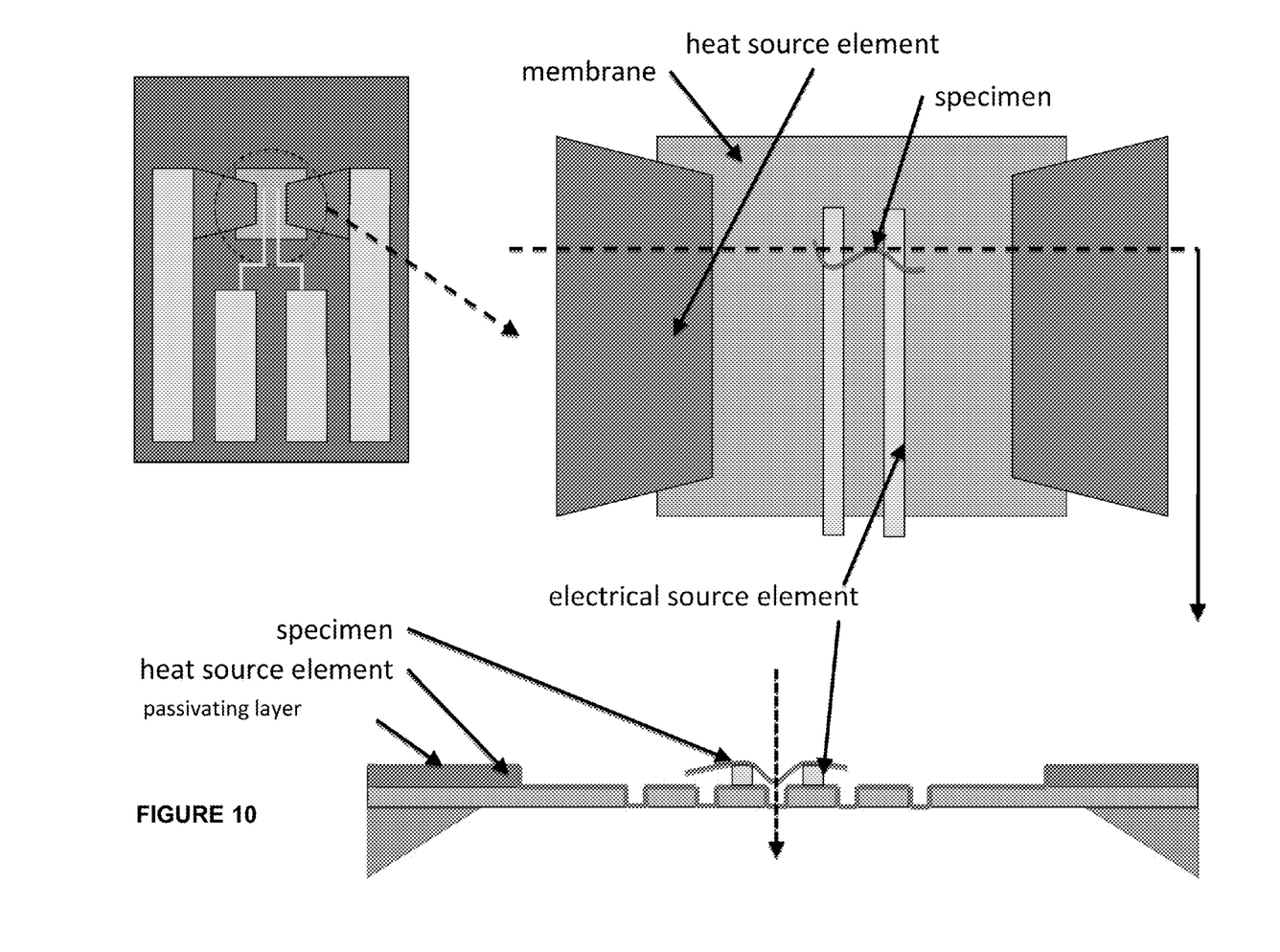
FIG. 10 illustrates a device having electro-thermal capabilities.

Devices can also contain both a heat source and an electrical source element or elements to allow electro-thermal testing of materials. Electro-thermal testing is particularly useful for studying specimens that have electrical properties that vary as a function of temperature. Using the heat source element, a specimen temperature can be controlled while simultaneously measuring properties such as conductivity in the electron microscope. To keep the electrical signals between the heat source and electrical source elements isolated, a thin passivation layer is deposited on top of the membrane, as introduced in International Patent Application No. PCT/US08/63200 filed on May 9, 2008 entitled "Microscopy Support Structures," as discussed hereinabove. This passivation layer is thin, generally less than 100 nm and greater than 5 nm, and amorphous and preferably comprises silicon nitride. This allows electrical isolation and a sample support in a non electron-beam scattering thin film. For example, referring to FIG. 10, an electro-thermal device is illustrated, wherein the passivating layer isolates the membrane from the electrical source element.

Each device preferably has a frame, which is a thick region generally around the perimeter of the device. The frame gives mechanical support to the device to allow for handling, and provides a strong surface to support the membrane region and allow for good contact between the device and the holder. It will also provide a level of thermal isolation between membrane regions on a device with multiple membrane regions. Frames are typically about 12 microns thick or greater, with preferred embodiments at about 12, 25, 50, 200 and 300 microns, or any variation in between, thick. The frame region is generally outside the observation region of the device. The preferred frame material is single crystal silicon, although frames may also be made from polysilicon, quartz or fused silica.

Frames may be circular, rectangular, square or polygonal at the perimeter. In devices with multiple membrane regions, the frame will also exist between the membrane regions to provide mechanical support as well as thermal isolation when used as a temperature control device. The membrane regions may also be square, rectangular, circular or polygonal.

It should be appreciated by one skilled in the art that the description of a temperature control device provided herein is not intended to limit same. Variations of temperature control devices are contemplated.

When a temperature device as described herein is used in a chamber (external or within a microscope) that allows the control of gases and/or liquids at the observation region, it becomes part of an environmental cell. To prevent leaks, seals can be formed either using components such as washers on the devices themselves, or on the holder. These arrangements also form an environmental cell, or E-cell. Although E-cells may be used outside of an electron microscope, they are generally most useful when placed within an electron microscope to allow changes to the environment to take place while the impact of those changes are observed through imaging and/or analysis. Environmental cells are generally constructed using either one or more window devices, one or more temperature control devices, or a combination of one or more window device(s) and temperature control device(s). Environmental cells and holders are described in more detail in the aforementioned International Patent Application No. PCT/US08/63200, U.S. Provisional Patent Application No. 60/916,916, and U.S. Provisional Patent Application No. 60/974,384.

Methods of Using Temperature Control Devices

In practice, a specimen is placed on the temperature control device for imaging in an electron microscope, wherein the temperature control device is or is not part of an environmental cell. Using the heat source elements and the heat sinks, the temperature of the specimen can be raised very quickly (on the order of $10^{6\circ}$ C./sec) or very slowly, or cooled very quickly (on the order of $10^{4\circ}$ C./sec) or very slowly. This is a great advance over prior art in situ technology which typically takes several minutes to heat or to cool. Also using the heat source elements and/or heat sinks, a controllable thermal gradient can be provided by the temperature control device so that a range of temperatures can be provided simultaneously either to different specimens on the same temperature control device, to a single specimen on a temperature control device, or both. This is a great advantage over prior art in situ technology that typically provides a single temperature plus or minus a large tolerance to specimen(s).

Many thermally-activated material reactions are dependent upon the rate at which the temperature is changed. A temperature control device that can precisely control the rate of temperature change can be used to study reactions that require rapid temperature increases, slow (or highly controlled) temperature increases, rapid temperature decreases or slow temperature decreases. Reactions requiring rapid temperature increases (e.g., temperature rise times on the order of greater than $10^{4\circ}$ C./sec) include dopant activation, annealing, gasification and pyrolysis of biomass, and explosions with core/shell particles. Slow (or highly controlled) temperature increases (e.g., on the order of less than $10°$ C./sec) are required when materials experience irreversible phase changes (e.g., the austenite-martensite in steel) because it is important to not exceed the temperature at which the irreversible change occurs. The temperature control device can adjust the temperature by fractional degrees without temperature overshoot and as such, the temperature can be reliably controlled and irreversible reactions can be investigated while imaging in the electron microscope. Reactions requiring rapid cooling rates (e.g., on the order of greater than $10^{4\circ}$ C./sec) include quenching. Reactions requiring slow cooling rates (e.g., on the order of less than $10°$ C./sec) include the study of expansion and strain.

In one aspect, a method of determining beam-induced heating is described. It is understood that when examining a specimen with an electron beam, the beam can alter the specimen through beam-induced heating. Beam induced heating can be studied in a number of ways. This technique can be done in SEM, TEM and STEM instruments, in atmosphere, gas environments or in vacuum. In one embodiment, materials with phase transformations at precisely known temperatures can be studied using single temperature control devices. The temperature control device can be used to adjust the temperature of the specimen while imaging with the electron beam until the desired phase transformation occurs (as verified through imaging) and the temperature at which the phase transformation occurs can be compared to the temperature provided by the temperature control device. The difference between the temperature achieved by the temperature control device and the known transformation temperature is related to the temperature induced by the electron beam. Multiple specimens and repeated experiments can provide the necessary statistical data to understand the beam-induced heating. In another embodiment, materials with phase transformations at precisely known temperatures can be studied using multiple heaters or with holders that fixture multiple heating devices. The same material specimen can be applied to multiple heater (or multiple devices) and then the specimens can be simultaneously or independently heated whereby one specimen (the experiment) is heated with imaging (with the electron beam) and the other specimen (the control) is heated but not imaged. Heating occurs until the desired transformation is observed (through imaging) in the experimental specimen and then heating is terminated for both the control and the experimental specimen. At the completion of heating, the control is imaged. The difference in control and experimental specimens are investigated to quantify the beam-induced effects. For example, if there was beam-induced heating, the experimental specimen will have undergone the phase transformation but the control specimen will not have because less heat energy was introduced to the control.

Figure 5:
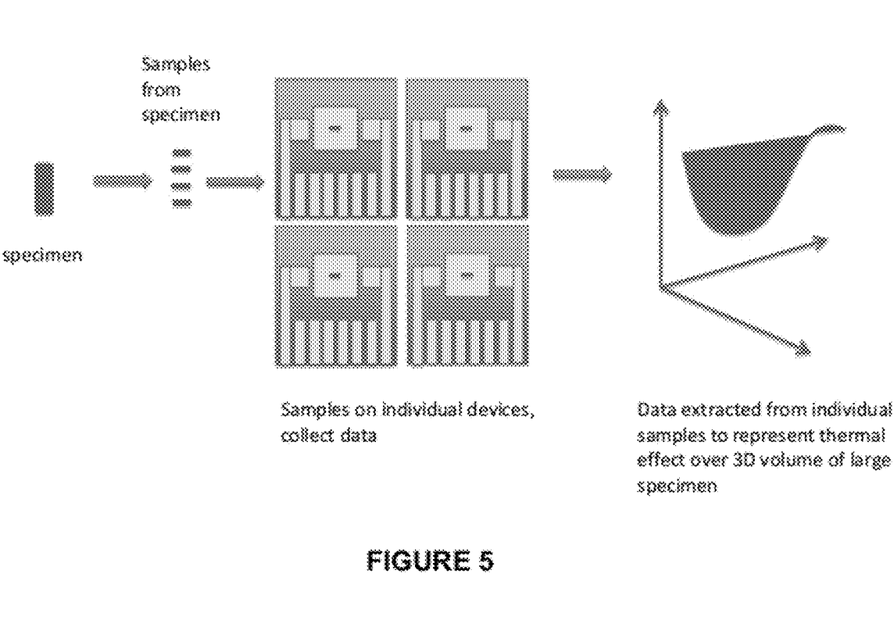
FIG. 5 illustrates a method of studying a large sample to achieve a 3D reconstruction of said sample.

In another aspect, a method of achieving a three-dimensional reconstruction of a sample is described. Referring to FIG. 5, studying a large sample can be achieved by preparing multiple, serial specimens from the large sample, studying each specimen with an electron microscope and then combining the data from the individual specimens to achieve a 3D reconstruction of the sample. This method can be useful to study multiple transformations and processes including, but not limited to, diffusion, annealing, gettering, grain boundary movement and other thermally activated processes in large samples. The serial specimens can be studied on multiple devices each with individual heating elements, on single devices with multiple heaters, and/or a combination of devices. Data from each specimen can be extracted and combined with data from the other serial specimens to create a 3D representation of the thermal processes in the sample volume. Examples of data extracted from each specimen include, but are not limited to, diffusion rates, composition changes over time, and annealing times/temperatures for defect recovery. Specimen sizing is important in this technique as some effects (such as grain boundary movement) are specimen-size dependent, as readily determined by one skilled in the art. This technique can be done in SEM, TEM and STEM instruments, in gas environments or in vacuum.

In yet another aspect, a method of "time-slicing" a reaction is described. It is known that certain critical reactions are difficult to capture with existing technology because they occur too fast. For example, the diffusion of atoms through a semiconductor layer can occur in just seconds. Characterizing this reaction using prior art microanalysis is very difficult since images can take up to twenty seconds to gather, and microanalysis can take up to several minutes. To overcome this problem, the effective slowing of the reaction is described whereby the reaction is slowed using fast heat pulses and "pausing" the reaction between pulses, as illustrated schematically in FIG. 6. For example, to "time-slice" a reaction of z units (e.g., 1 sec), the reaction can be divided into x segments (e.g., 100) of y subunits (e.g., ten milliseconds) each. It should be appreciated that x and y can be any numbers that mathematically add up to the length of the reaction (i.e., z units). The x segments may be equal in length or may be varied as readily determined by one skilled in the art. The y time can be any metrics from nanoseconds to microseconds to seconds to minutes to hours. In practice, the specimen can be pulse heated for y subunits on the temperature control device, "paused" by cooling the specimen (i.e., allowing the heat to be withdrawn from the specimen site by the heat sinks of the temperature control device), image/perform microanalysis as needed, pulse heat for another y subunits, "paused" for cooling, image/perform microanalysis, etc. In this example, at the end of the experiment, the specimen will have seen a determinable amount of heat, and the data can be reconstructed to illustrate how the reaction progressed over time. Although the heat pulses illustrated in FIG. 6 suggest that the $\Delta T$ should be identical for each pulse, it should be appreciated that the $\Delta T$ may be varied over the length of the experiment, as readily determined by one skilled in the art. This technique is only possible if the heat source can heat and cool the sample very quickly because the heating and cooling rate must be much faster than the time of each "segment." Conventional in situ heating technology takes several minutes to heat and cool, making it unable to perform this technique for many interesting reactions. It will be appreciated by one skilled in the art that the specimen may be imaged during the heat pulses, during the cooling, following cooling, or combinations of any of the above.

In yet another aspect, a method of studying the impact of quenching is described. Quenching occurs when a sample is cooled very rapidly. Typically, a material passes through different phase transitions with changing temperature and by cooling the sample very fast, certain phase transitions can be avoided and the high-temperature structure of the material can be maintained down to room temperature. Because the structure of a material impacts its properties (e.g., morphology, mechanical strength, etc), quenching can be used to optimize material properties and create new alloys. In practice, a specimen on a temperature control device is heated to a desired temperature and the sample is imaged and microanalysis performed to fully characterize the specimen. Upon reaching a desired such as a specific phase or morphology, the heat source is removed and the specimen cools quickly to room temperature, on the order of $10^{4\circ}$ C./sec. The specimen can then be imaged and analyzed to study the impact of the quenching. This technique is only possible if the specimen can undergo very rapid cooling, specifically much faster than the phase transition. Conventional in situ technology takes several minutes to cool, which is far too slow to avoid intermediate phases and thus making it useless for quenching experiments.

Figure 6:
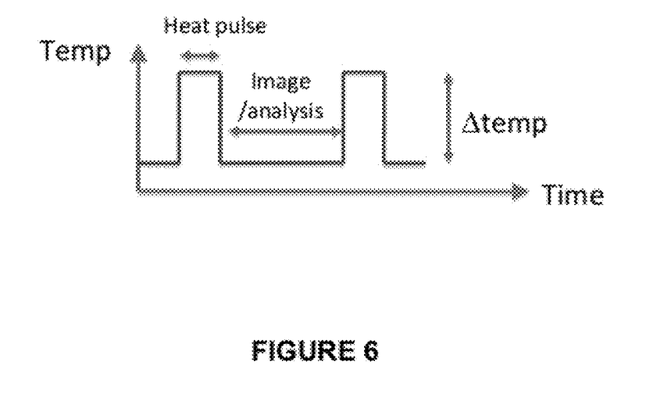
FIG. 6 illustrates a method of "time-slicing" a reaction using a temperature control device.

In still another aspect, a method of studying gettering through thermal annealing is described. Gettering is the process of removing defects or impurities from a material and is an important process for many industries since performance is a function of how well defects/impurities can be removed. For example, gettering of defects in silicon (through a combination of mechanical stress and annealing) allows for high performance, improved uniformity, and high yield. In practice, defects can be identified at room temperature and characterized via a combination of imaging and microanalysis. Then, high temperature pulses, for example as illustrated in FIG. 6, can be applied to the specimen, and between pulses the defect region can be inspected to study the impact of the thermal anneal on the defects. This technique is most useful when the heat source can heat and cool the sample very quickly. Gettering can be a long or short process, depending on the temperature changes chosen. To study fast, high-temperature gettering processes, the heating and cooling rate must be much faster than the gettering time. Conventional in situ technology takes several minutes to heat and cool, making it useless for most gettering reactions.

Figure 7:
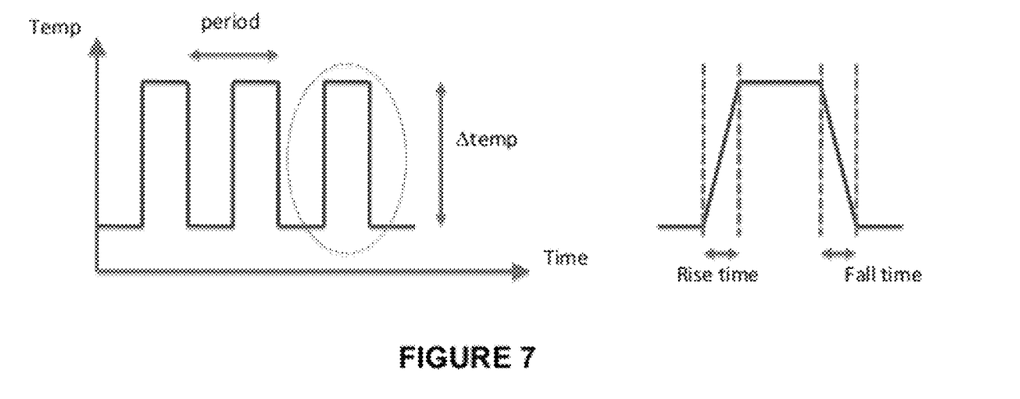
FIG. 7 illustrates a method of performing lifetime testing using a temperature control device.

In another aspect, a method of performing lifetime testing is described. Lifetime testing involves cycling temperatures many times to simulate years of fatigue and environmental changes. At the nanoscale, this is very difficult to do because a technology to simultaneously observe and quickly cycle temperatures has not previously existed. Using a temperature control device with a fast temperature response and very high stability, lifetime testing can be done directly within the electron microscope. Imaging generally occurs throughout the test, but particularly just before and just after a series of cycles (at high or low temperatures). Referring to FIG. 7, rise times and fall times are generally 1 millisecond to 10 second, periods from less than 10 milliseconds to greater than 10 seconds, and $\Delta T$'s can be a few degrees C. to greater than 1000° C. Analogous to the time slicing method described herein, the periods may be the same as or different from one another, the rise time and fall times may be the same as or different from one another, and the $\Delta T$ may be the same as or different from one another. The total number of cycles is generally from 5-10 to many tens of thousands and more. This technique can be done in SEM, TEM and STEM instruments, in gas environments or in vacuum.

In another aspect, a method of performing electrothermal analysis is described. By providing a temperature control device with added electrical sense or source elements, it is possible to prepare a specimen such that thermal stimulus may be applied while simultaneously monitoring an electrical property or properties of the specimen. Specimens can be simultaneously imaged and electrically analyzed over a single, millisecond-scale temperature cycle, over a long temperature cycle of arbitrary duration, and/or over multiple thermal treatments and temperature cycles. This electrothermal analysis technique can be advantageous to understanding the thermal dependence of electrical properties of materials. Moreover, by simultaneously electron imaging, acquiring/analyzing transmitted electrons and/or the x-rays that are emitted from the specimen's surface as a result of electron interaction with the specimen and monitoring an electrical property or properties of the specimen while using this electrothermal technique, the electrical behavior of the specimen can be correlated to the size, shape, morphology, orientation, chemical composition and/or structure of the specimen. Electrothermal techniques can be done in SEM, TEM and STEM instruments, in gas environments, liquid environments or in vacuum.

In another aspect, a method of operating the temperature control devices via software is described. Because the temperature control devices can provide thermal ramp rates on the order of 10E6° C./sec, it is advantageous to have software control the rate and duration of Joule heating by controlling the timing and magnitude of current applied to the heat source element(s). Under software control, temperature cycling, temperature ramp rates, quenching rates, independent control of multiple temperature source elements, and/or arbitrary temperature profiles can be applied to specimens. Software control also allows for precise data logging of the time and temperature profile applied to a specimen. Providing software control and data logging for a system with millisecond-scale thermal ramp rates as in the present invention is a great advance over prior art in situ technology since the data log can be used to analyze the precise thermal treatment applied to the specimen.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

We claim:

1. A method of determining temperature of at least one heat source element on a semiconductor temperature control device in an electron microscope using a temperature sense element, said method comprising:
   (a) introducing a liquid or a gas environment to the semiconductor temperature control device and measuring conductivity or impedance of the temperature sense element, wherein the conductivity or impedance is a measure of the heat flux of the environment of at least one heat source element; and
   (b) determining the temperature of the at least one heat source element from a measured temperature and the heat flux measurement determined using the temperature sense element,
   wherein the at least one heat source element is positioned on top of a conductive membrane on the semiconductor temperature control device, and either:
   (i) the at least one heat source element is the temperature sense element; or
   (ii) the temperature sense element is a wire or thermocouple patterned in proximity of the conductive membrane.

2. The method of claim 1, wherein the temperature sense element is a wire or thermocouple patterned on the conductive membrane.

3. The method of claim 1, wherein the temperature sense element is a wire or thermocouple patterned off the conductive membrane but on the semiconductor temperature control device.

4. The method of claim 1, wherein the semiconductor temperature control device comprises two heat source elements in a flanking position across the conductive membrane, with an observation region defined between the two heat source elements, and wherein the observation region is heatable.

5. The method of claim 1, wherein the temperature of the temperature sense element decreases when the liquid or gas environment is introduced to the semiconductor temperature control device.

6. The method of claim 1, wherein the temperature sense element is a platinum resistance thermometer.

7. The method of claim 1, wherein the at least one heat source element comprises silicon carbide or a refractory metal selected from the group consisting of tungsten, niobium, tantalum, molybdenum, rhenium, osmium, iridium, rhodium, ruthenium, technetium, hafnium, zirconium, vanadium, chromium, platinum, palladium and alloys thereof.

8. A method of performing electrothermal analysis on a specimen in an electron microscope using a semiconductor temperature control device, said method comprising:
   (a) positioning at least one electrical source element directly on a passivation layer which is positioned on top of a conductive membrane of the semiconductor temperature control device, wherein the semiconductor temperature control device further comprises at least one heat source element positioned between the conductive membrane and the passivation layer;
   (b) positioning the specimen on the at least one electrical source element; and
   (c) applying a thermal stimulus to the specimen while simultaneously monitoring at least one electrical property and imaging said specimen.

9. The method of claim 8, wherein the conductive membrane is less than 1 micron in thickness.

10. The method of claim 8, comprising at least two heat source elements that flank the conductive membrane observation region, wherein the membrane observation region is heatable.

11. The method of claim 8, wherein the electrothermal analysis is performed in gas environments, liquid environments or in vacuum.

12. A method of observing quenching in an electron microscope, said method comprising:
   (a) placing a specimen on a semiconductor temperature control device;
   (b) raising the temperature of the specimen while simultaneously imaging the phase or morphology of the specimen;
   (c) cooling the specimen to room temperature on the order of $10^{4}$° C./sec, wherein the cooling occurs at a rate that is faster than the phase transition of the specimen; and
   (d) imaging the specimen subsequent to cooling,
   wherein the semiconductor temperature control device comprises a conductive membrane comprising at least one membrane observation region, and at least two heat source elements in contact with the conductive membrane such that the membrane observation region is heatable.

13. The method of claim 12, wherein the at least two heat source elements flank the conductive membrane observation region.

14. The method of claim 12, wherein the device comprises more than one membrane observation regions.

* * * * *